United States Patent
Tsorng et al.

(10) Patent No.: US 11,536,292 B2
(45) Date of Patent: Dec. 27, 2022

(54) MECHANISM FOR PREVENTING REFLOW FOR FAN FLAP FAILURE

(71) Applicant: QUANTA COMPUTER INC., Taoyuan (TW)

(72) Inventors: Yaw-Tzorng Tsorng, Taoyuan (TW); Chun Chang, Taoyuan (TW); Ting-Kuang Pao, Taoyuan (TW); Chih-Hao Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 957 days.

(21) Appl. No.: 16/354,785

(22) Filed: Mar. 15, 2019

(65) Prior Publication Data

US 2020/0291962 A1  Sep. 17, 2020

(51) Int. Cl.
*H05K 7/20* (2006.01)
*F04D 29/60* (2006.01)

(52) U.S. Cl.
CPC ......... *F04D 29/604* (2013.01); *H05K 7/2019* (2013.01); *H05K 7/20145* (2013.01); *H05K 7/20172* (2013.01); *H05K 7/20181* (2013.01); *H05K 7/20581* (2013.01); *Y10T 292/438* (2015.04)

(58) Field of Classification Search
CPC . F04D 29/604; F04D 29/403; H05K 7/20145; H05K 7/20172; H05K 7/20181; H05K 7/2019; H05K 7/20581; Y10T 292/438; G06F 1/20
USPC ..................................... 361/679.48
See application file for complete search history.

(56) References Cited

U.S. PATENT DOCUMENTS

| | | | |
|---|---|---|---|
| 2005/0105269 A1* | 5/2005 | Chen ................. | H05K 7/20172 361/695 |
| 2006/0003683 A1* | 1/2006 | Chen ................. | H05K 7/20172 454/184 |
| 2012/0149294 A1* | 6/2012 | Labrecque ............. | F24F 7/013 454/353 |
| 2012/0156019 A1* | 6/2012 | Gong ....................... | G06F 1/20 415/182.1 |
| 2012/0163971 A1* | 6/2012 | Chiu ..................... | F04D 29/522 415/213.1 |
| 2015/0069897 A1* | 3/2015 | Chen ........................ | G06F 1/20 49/358 |
| 2015/0146381 A1* | 5/2015 | Huang ............... | H05K 7/20172 361/727 |
| 2015/0351280 A1* | 12/2015 | Gonzalez Inda ....... | G06F 1/181 415/126 |

(Continued)

*Primary Examiner* — Anatoly Vortman
*Assistant Examiner* — Zhengfu J Feng
(74) *Attorney, Agent, or Firm* — Nixon Peabody LLP

(57) ABSTRACT

A fan assembly includes a socket to receive a fan module, a fan flap coupled to a first side wall of the socket, and an anti-reflow device coupled to a second side wall of the socket. The fan flap moves in a curved path between a first position and a second position. The anti-reflow device has an attachment feature, an embossed feature, and a stopping feature. The attachment feature attaches the anti-reflow device to the second side wall. The embossed feature extends through a first aperture in the second side wall. The stopping feature extends through a second aperture in the second side wall and contacts the fan flap. When the fan module is removed, the stopping feature retains the fan flap in the first position to block the socket and prevent air from reflowing through the socket.

20 Claims, 9 Drawing Sheets

(56) References Cited

U.S. PATENT DOCUMENTS

| | | | |
|---|---|---|---|
| 2016/0219754 A1* | 7/2016 | Anderl | F04D 25/166 |
| 2017/0042060 A1* | 2/2017 | Chen | F04D 25/0613 |
| 2020/0060042 A1* | 2/2020 | Liu | H05K 7/20145 |
| 2020/0146185 A1* | 5/2020 | Wu | H05K 7/20172 |

* cited by examiner

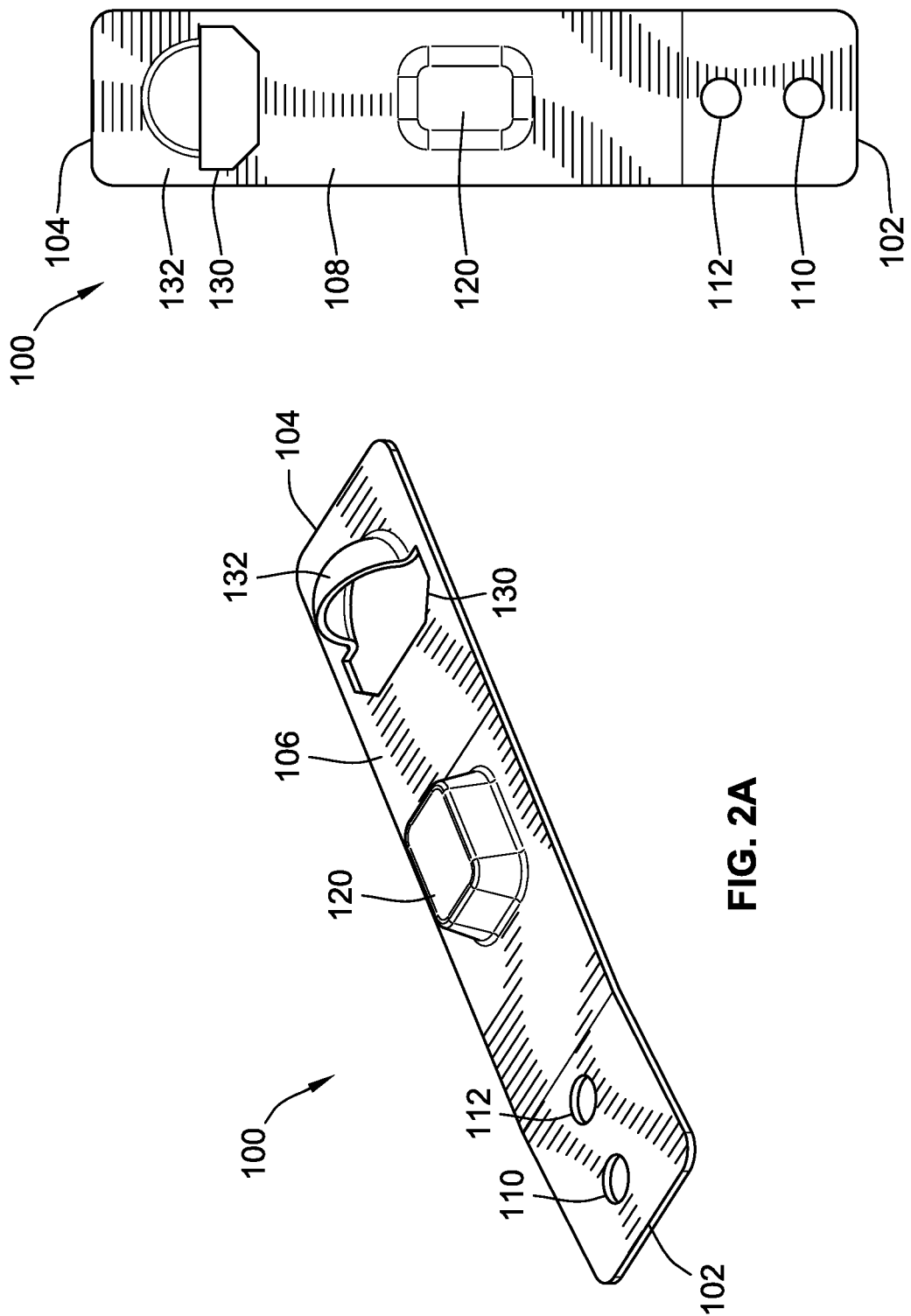

МECHANISM FOR PREVENTING REFLOW FOR FAN FLAP FAILURE

TECHNICAL FIELD

The present disclosure relates generally to a fan system. More particularly, aspects of this disclosure relate to an integrated fan wall system that includes a mechanism to prevent fan flap failure.

BACKGROUND

Electronic devices, such as servers, include numerous electronic components that are powered by a common power supply. Servers generate an enormous amount of heat due to the operation of internal electronic devices such as controllers, processors, and memory. Overheating from the inefficient removal of such heat has the potential to shut down or impede the operation of such devices. Thus, servers are designed to rely on air flow through the interior of the device to carry away heat generated from electronic components. Servers often include various heat sinks that are attached to the electronic components such as processing units. Heat sinks are typically composed of thermally conductive material. Heat sinks absorb the heat from the electronic components, thus transferring the heat away from the components. The heat from heat sinks must be vented away from the server. The air flow to vent away such heat is often generated by a fan system.

A typical fan system will include multiple fans. Such fans may be grouped together in a fan wall to provide maximum cooling. Further, additional fans provide redundancy that allows for the operation of the server even if one of the fans in the fan wall fails. A fan wall is composed of modular fans, which may individually be replaced if one fails, thereby allowing for continued the operation of the fan wall and thus the associated server.

FIG. 1 is a perspective view of a fan wall 20 that can be included as part of a computing device or system, such as a server. The components of the server are cooled by the fan wall 20 during server operation. The fan wall 20 in this example includes vertical walls 22, 24, and 26 that are formed from vertical sheets. The fan wall 20 also includes horizontal shelves 32, 34, and 36. The vertical walls 22, 24, and 26, in conjunction with the horizontal shelves 32, 34, and 36, form sockets for holding fan modules, such as fan modules 40, 42, 44, 46, and 48. A fan module such as fan module 40 may be removed from a respective socket 50. In this example, the socket 50 is defined by vertical walls 22 and 24, and shelf 32. The fan module 40 includes a rotatable bracket 52 that includes a knob 54. The bracket 52 rotates from an axis at the bottom edge of the fan module 40. When the fan module 40 is inserted in the socket 50, the rotatable bracket 52 is moved to an upward position to lock the fan module 40 in place. When the fan module 40 needs to be replaced, a user can pull on the knob 54 and pull the bracket 52 down to release the fan module 40 from the socket 50.

For preventing air reflow during hot swapping a fan module such as the fan module 40, each of the sockets includes a fan flap in the respective sockets. An example fan flap is a fan flap 60 in the socket 50. The fan flap 60 is mounted on a hinge on the vertical wall 24. The fan flap 60 is normally forced by the insertion of the fan module 40 into the socket 50 to be rotated to a position flush against vertical wall 24.

A removal of the fan module 40 from the socket 50 may occur if the example fan module 40 fails. In such a case, the other fan modules 42, 44, 46, and 48 continue to operate to cool the server. The airflow from the other fans creates an air reflow, as shown by the arrows 70 creating a pressure drop. When the fan module 40 is removed, a spring mechanism causes the fan flap 60 to swing away from the vertical wall 24, as shown in FIG. 1, to block the socket 50 formerly occupied by the fan module 40. The fan flap 60 therefore blocks air flow through the socket 50 that may impede the cooling generated by the air flow from the other fan modules.

However, once the fan module 40 is removed from the socket 50, the fan flap 60 might move inwards toward the vertical wall 24 due to the pressure drop of the empty socket 50 overcoming the force of the spring mechanism. When the fan flap 60 moves inward, it fails to block the socket 50, and air flow may occur through the socket 50, thereby impeding the cooling function of the fan wall 20. The fan flap fail rate increases as requirements for fan power grows dramatically in recent server systems. Thus, an effective anti-reflow mechanism to prevent fan flap failure is required.

Thus, there is a need for a fan system that uses an effective mechanism to prevent reflow when a fan module needs to be replaced. There is a further need for a fan flap structure that may be adapted for different fan module structures.

SUMMARY

The various examples of the present disclosure are directed towards devices and systems for preventing failure of a fan wall. In a first embodiment of the present disclosure, an anti-reflow device for preventing failure of a swinging fan flap in a socket is provided. The anti-reflow device comprises a plate, an attachment feature, an embossed feature, and a stopping feature. The plate has a proximal end and a distal end. The attachment feature is disposed at the proximal end of the plate, and is configured to attach the proximal end of the plate to a wall of the socket to allow the distal end of the plate to move relative to the wall. The embossed feature extends from the plate between the proximal end and the distal end. The embossed feature is configured to contact a fan module inserted into the socket. The stopping feature extends from the distal end of the plate and is configured to contact the swinging fan flap.

In some examples of the first embodiment, the plate has a rectangular shape.

In some examples of the first embodiment, the attachment feature includes one or more holes. Each of the one or more holes can be configured to receive at least one fastener to attach the plate to a wall of the socket.

In some examples of the first embodiment, the plate is fabricated from metal, such as sheet metal or die cast metal, or from plastic.

In some examples of the first embodiment, the stopping feature has a half-dome shape.

In some examples of the first embodiment, the embossed feature has a rectangular shape.

In some examples of the first embodiment, the anti-reflow device further comprises a relief cutout defined in the plate between the embossed feature and the stopping feature.

In some examples of the first embodiment, the anti-reflow device is held by a fan module frame. The fan module frame comprises a side support, a bottom support, a top support, and a support tab. The side support has a top end and a bottom end. The top support has one end coupled to the top end of the side support. The bottom support has one end coupled to the bottom end of the side support. The support tab extends from the side support and is configured to hold the distal end of the anti-reflow device.

In a second embodiment of the present disclosure, a modular fan assembly comprises a socket, a fan flap, and an anti-reflow device. The socket is configured to receive a fan module, and is defined by a first side wall, a second side wall, and a horizontal shelf. The fan flap is rotatably coupled to the first side wall and is configured to move in a curved path relative to the first side wall. The anti-reflow device is coupled to the second side wall and has a proximal end and a distal end.

In the second embodiment, the anti-reflow device includes an attachment feature, an embossed feature, and a stopping feature. The attachment feature is disposed at the proximal end and is configured to attach the proximal end to the second side wall of the socket. The embossed feature is disposed between the proximal end and the distal end. The embossed feature is configured to contact a fan module responsive to the fan module being inserted into the socket. The stopping feature is disposed at the distal end and is configured to contact the swinging fan flap.

In some examples of the second embodiment, the fan flap is configured to move in the curved path between a first position and a second position.

In some examples of the second embodiment, when the fan flap is in the first position, a front edge of the fan flap is positioned between a front edge of the socket and the stopping feature.

In some examples of the second embodiment, when the fan flap is in the second position, the front edge of the fan flap is positioned between the stopping feature and the first side wall.

In some examples of the second embodiment, the stopping feature is configured to retain the fan flap in the first position when the fan module is removed from the socket.

In some examples of the second embodiment, the socket is configured to receive the fan module between the first side wall and the second side wall.

In some examples of the second embodiment, the anti-reflow device is coupled to a side of the second wall opposite the fan module, such that the second side wall is positioned between the anti-reflow device and the fan module.

In some examples of the second embodiment, a first aperture and a second aperture are defined in the second side wall.

In some examples of the second embodiment, the embossed feature of the anti-reflow device extends through the first aperture defined in the second side wall.

In some examples of the second embodiment, the stopping feature of the anti-reflow device extends through the second aperture defined in the second side wall, such that the stopping feature is positioned in the curved path of the fan flap.

In some examples of the second embodiment, the fan module contacts the embossed feature responsive to the fan module being received in the socket.

In some examples of the second embodiment, the contact between the fan module and the embossed feature causes the stopping feature to retract from the second aperture, such that the stopping feature is not positioned in the curved path of the fan flap.

In some examples of the second embodiment, the fan flap rotates along the curved path to a first position responsive to the fan module being removed from the socket. In the first position, a front edge of the fan flap is disposed between the stopping feature and a front edge of the socket.

In some examples of the second embodiment, the fan flap rotates along the curved path to a second position responsive to the fan module being fully inserted into the socket. In the second position, the front edge of the fan flap is disposed between the stopping feature and the second side wall.

In some examples of the second embodiment, the stopping feature prevents the fan flap from rotating from the first position to the second position when the fan module is removed from the socket.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which:

FIG. 2A is a perspective view of an example anti-reflow device to prevent a fan flap from failing by being pushed inward;

FIG. 2B is a plan view of the example anti-reflow device shown in FIG. 2A;

Figure 1:
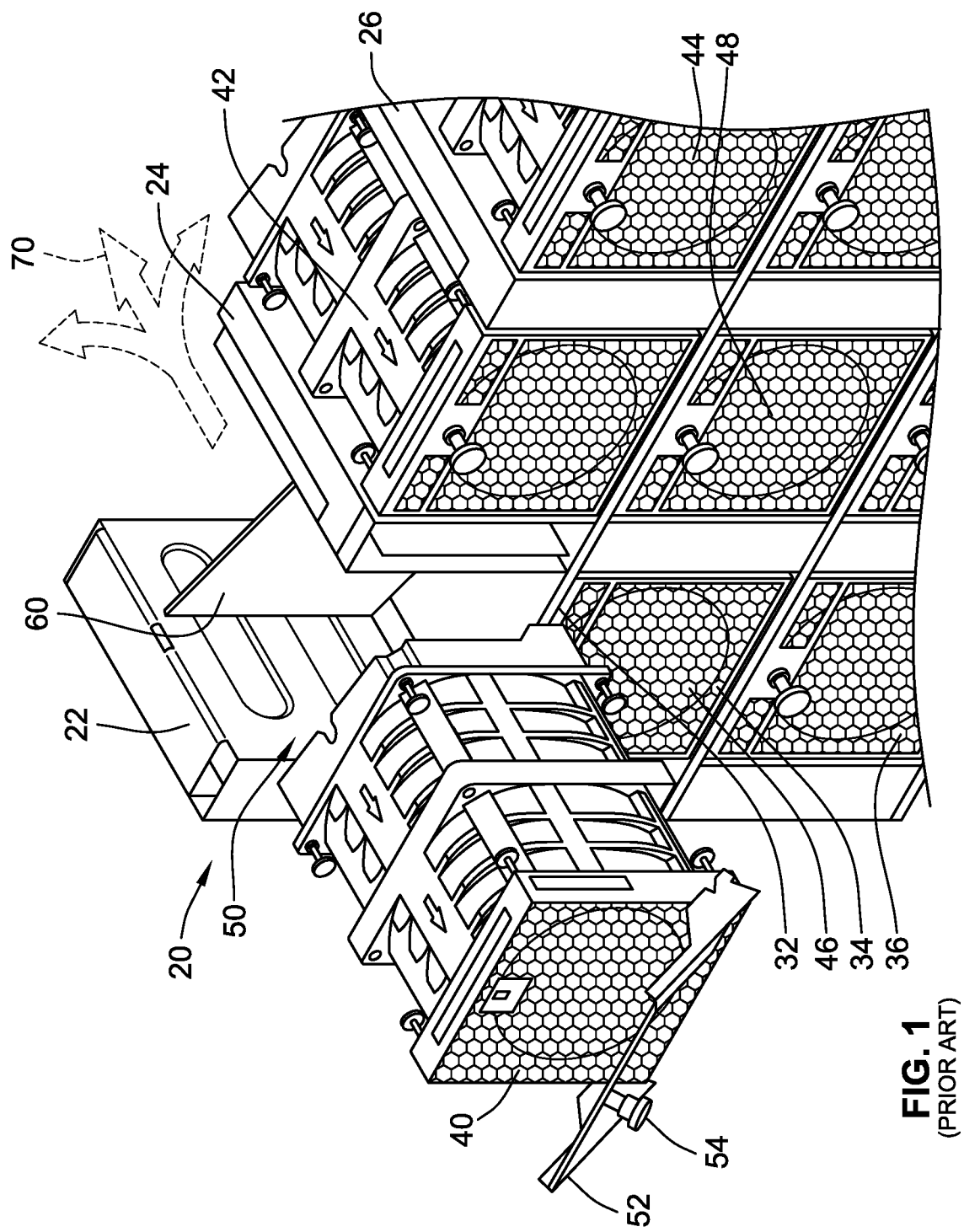
FIG. 1 is a prior art fan wall with fan modules showing the problem of air reflow when a fan module is removed.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure relates to an anti-reflow device that may be installed in a socket to prevent a fan flap from being pulled inward and thereby failing to block a vacant socket in a fan wall from air flow. FIG. 2A is a front perspective view of an example anti-reflow device 100 to prevent fan flaps from failing. FIG. 2B is a back perspective front view of the example anti-reflow device 100 shown in FIG. 2A. The anti-reflow device 100 is a roughly rectangular panel having a proximal end 102 and a distal end 104. Other shapes may also be used as long as the below described features are supported by the anti-reflow device. The anti-reflow device 100 is constructed of a flexible but strong material such as sheet metal, die cast metal, plastic, stainless steel (such as SUS304 stainless steel or SS304 stainless steel), copper alloys (such as beryllium copper) or any other suitable metal. The anti-reflow device could also be constructed of a flexible plastic.

The anti-reflow device 100 has a front side 106 and an opposite back side 108. The anti-reflow device 100 includes one or more attachment features to mount the anti-reflow device to the socket wall. In one implementation, the one or more attachment features include two holes 110 and 112 defined near the proximal end 102 of the anti-reflow device. The holes 110 and 112 are configured to accommodate fasteners to attach to the socket wall. The fasteners can be, for example, rivets, pins, bolts, clamps, screws, nails, etc.

Figure 3A:
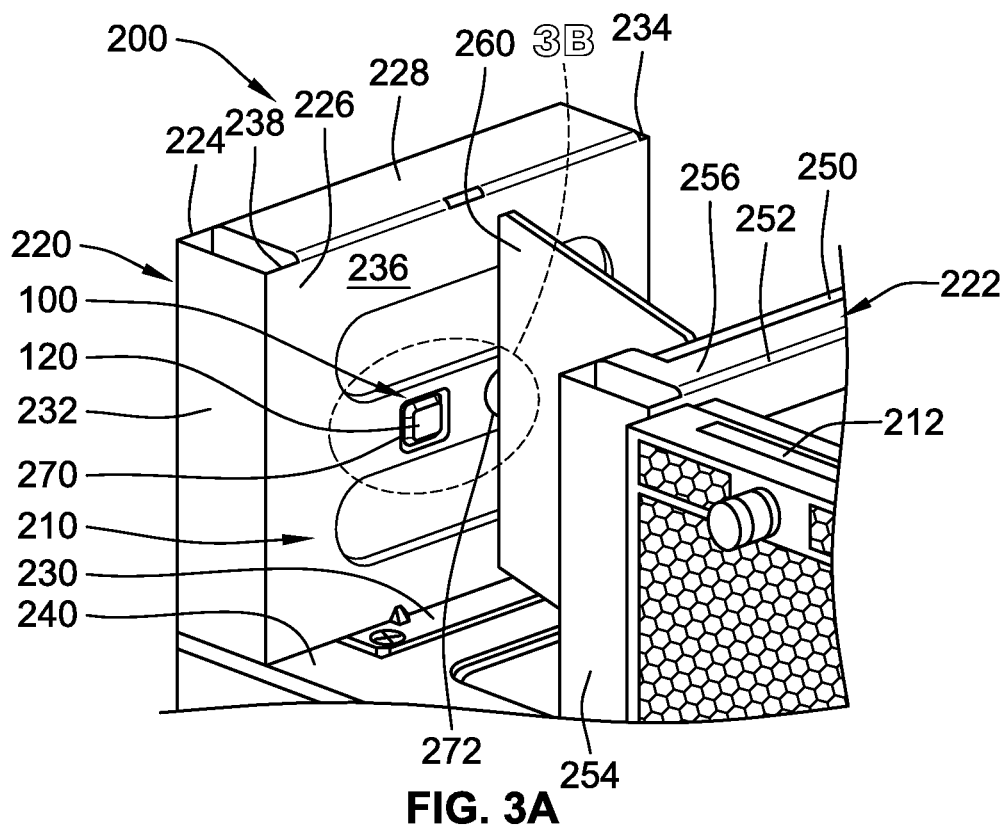
FIG. 3A is a perspective view of a socket with the example anti-reflow device in FIG. 2A installed.

An embossed feature 120 is formed near the center of the anti-reflow device 100 to extend from the front side 106. A relief cutout 130 can be formed near the distal end 104. The relief cutout 130 in this example is a semi-circular shape. A stopping feature 132 is formed to extend from the front side 106. In some implementations, the stopping feature 132 has a roughly half-dome shape, as shown in FIGS. 2A and 3A. However, the stopping feature 132 in other implementations may have different shapes. In some implementations, the anti-reflow device 100 does not include the relief cutout 130.

Figure 3B:
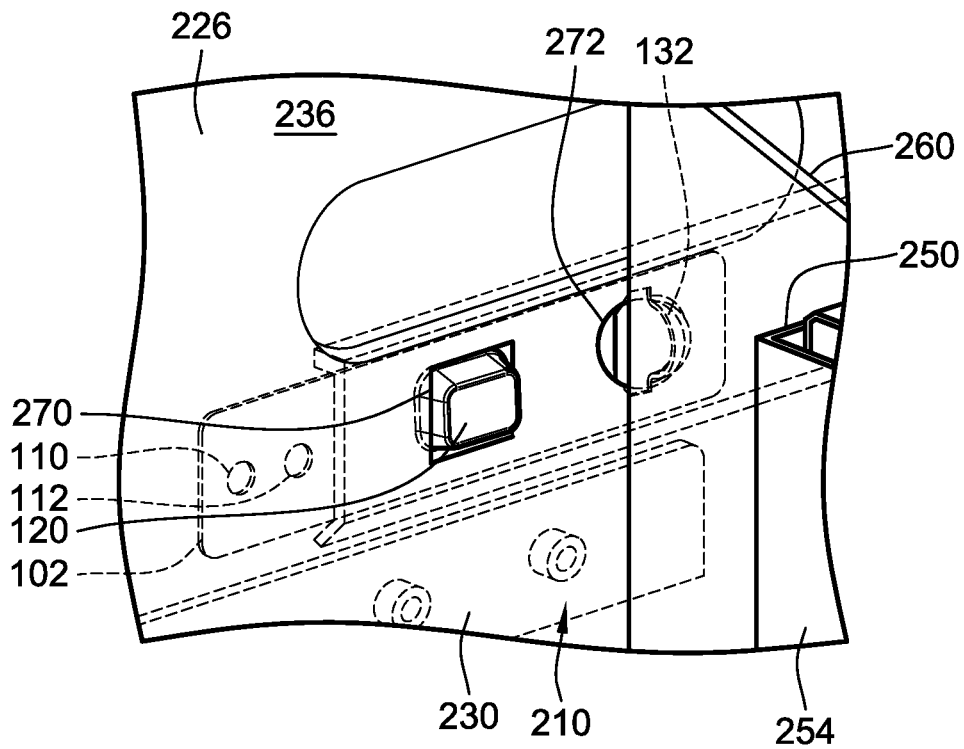
FIG. 3B is a perspective cutaway view of a socket in FIG. 3A with the example anti-reflow device in FIG. 2A installed.

FIG. 3A is a perspective view of a fan wall 200 and a corresponding socket 210 with the example anti-reflow device 100 of FIGS. 2A and 2B installed. FIG. 3B is a partially transparent perspective view of the socket 210 of FIG. 3A with the example anti-reflow device 100 of FIG. 2A installed. Air from the fan wall 200 cools the components of an electronic device such as a server. The fan wall 200 includes multiple fan modules—such as a fan module 212—that are inserted in sockets such as the socket 210. In this example, the fan wall 200 includes vertical walls 220 and 222. The vertical wall 220 is formed from two parallel side panels 224 and 226. The side panels 224 and 226 are joined at the top by a top panel 228. The opposite bottom of the side panels 224 and 226 are attached to a mounting bracket 230. A proximal panel 232 joins the front edges of the side panel 224 and 226. A distal panel 234 opposite the proximal panel 232 joins the back edges of the side panels 224 and 226. The side panel 226 includes an exterior surface 236 and an interior surface 238. The mounting bracket 230 is attached to a horizontal shelf 240.

The vertical wall 222 also includes parallel side panels 250 and 252 that are attached to a proximal panel 254 and a top panel 256. The side panel 250 pivotably supports a fan flap 260. As shown in FIG. 3A, the vertical walls 220 and 222 and horizontal shelf 240 form the socket 210. A fan module may thus be inserted on the horizontal shelf 240 between the vertical walls 220 and 222. The fan module when inserted in the socket 210 pushes the fan flap 260 against the side panel 250. When a fan module is not present in the socket 210 as shown in FIG. 3A, a spring mechanism forces the flap 260 to swing toward the exterior surface 236 of the side panel 224.

The anti-reflow device 100 shown in FIGS. 2A-2B is mounted on the interior surface 238 of the side panel 224, as shown in detail in FIG. 3B. In this example, fasteners such as rivets (not shown) may be installed through holes 110 and 112 to attach the proximal end 102 of the anti-reflow device 100 to the proximal end of the side panel 226. The side panel 226 includes a forward aperture 270 and a rear aperture 272. The forward aperture 270 is shaped roughly the same as the embossed feature 120 of the anti-reflow device 100. Thus, the embossed feature 120 extends through the forward aperture 270, as shown in FIGS. 3A and 3B. The rear aperture 272 is shaped roughly the same as the stopping feature 132 of the anti-reflow device 100. The stopping feature 132 extends through the rear aperture 272, as shown in FIGS. 3A and 3B. As will be explained below, the stopping feature 132 contacts the edge of the fan flap 260 and prevents the fan flap 260 from swinging inwardly (which would inadvertently stop the fan flap 260 from preventing reflow through the socket 210 when the fan module 212 is removed).

Figure 4A:
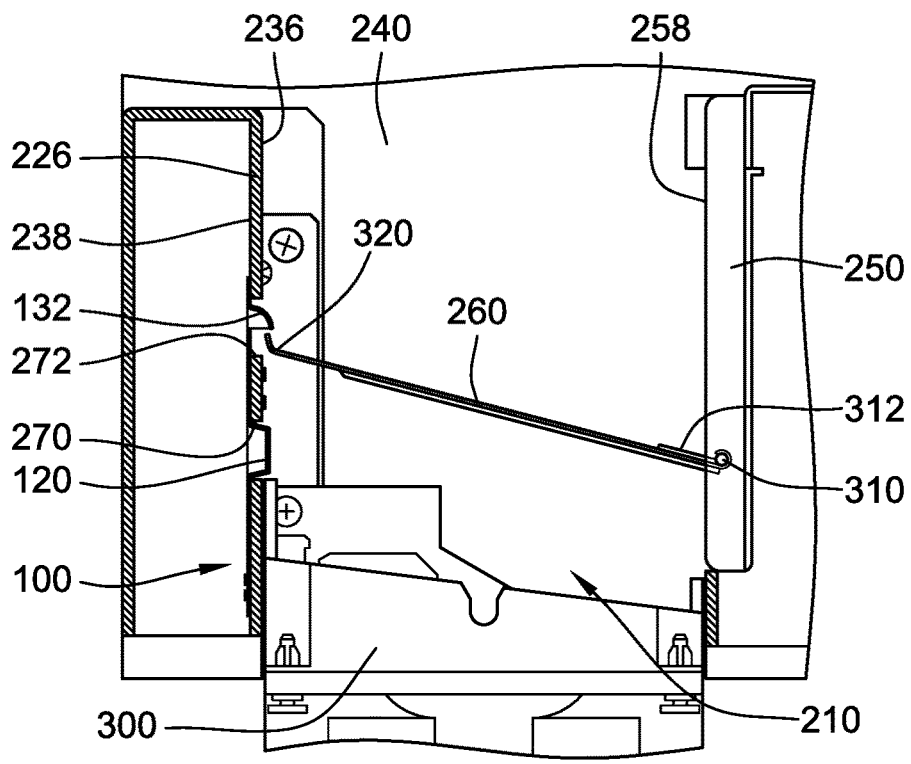
FIG. 4A is a top view of a fan module being inserted into a socket with the anti-reflow device in FIG. 2A installed.
Figure 4B:
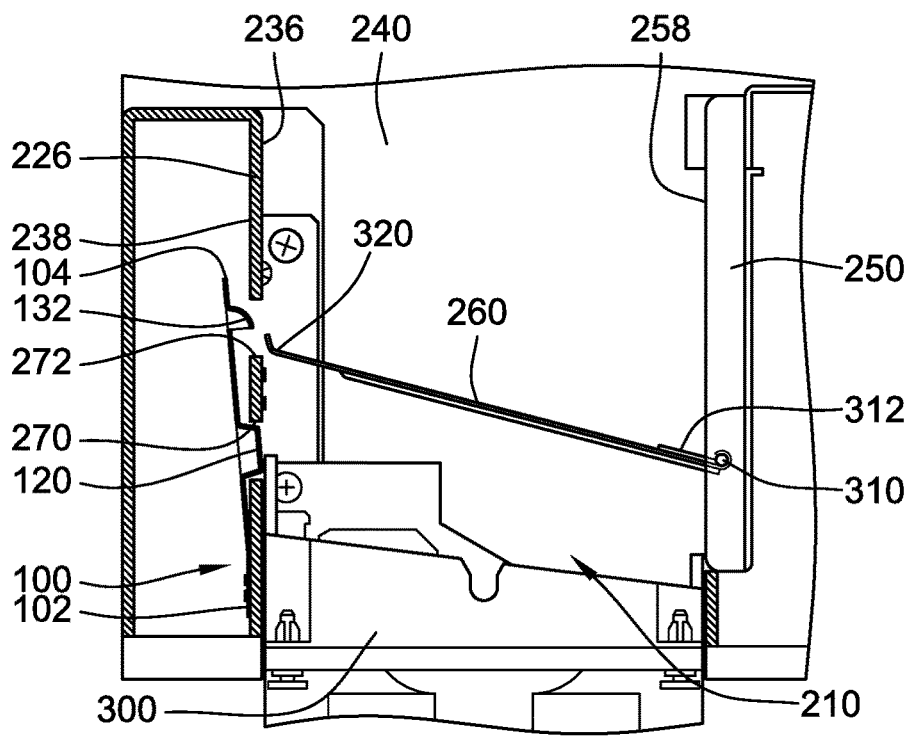
FIG. 4B is a top view of the fan module being inserted into the socket, showing the anti-reflow device being forced away from one of the socket walls to accommodate the fan module.
Figure 4C:
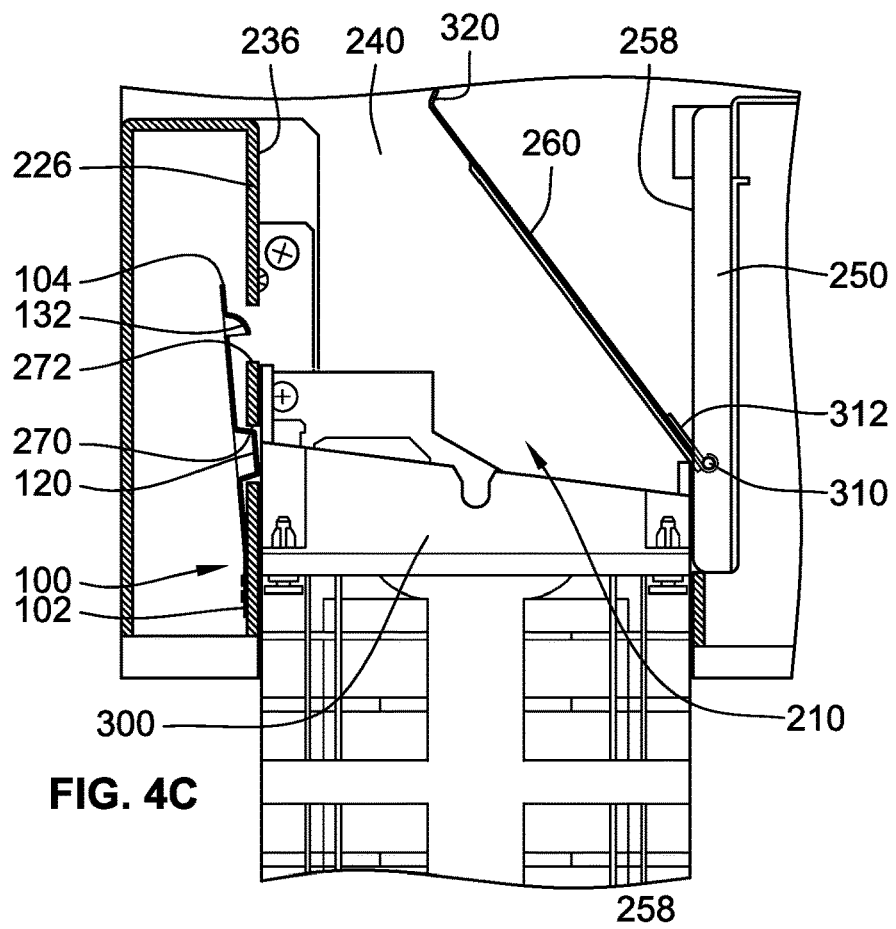
FIG. 4C is a top view of the fan module being inserted into the socket, showing a fan flap of the socket swinging past the anti-reflow device.
Figure 4D:
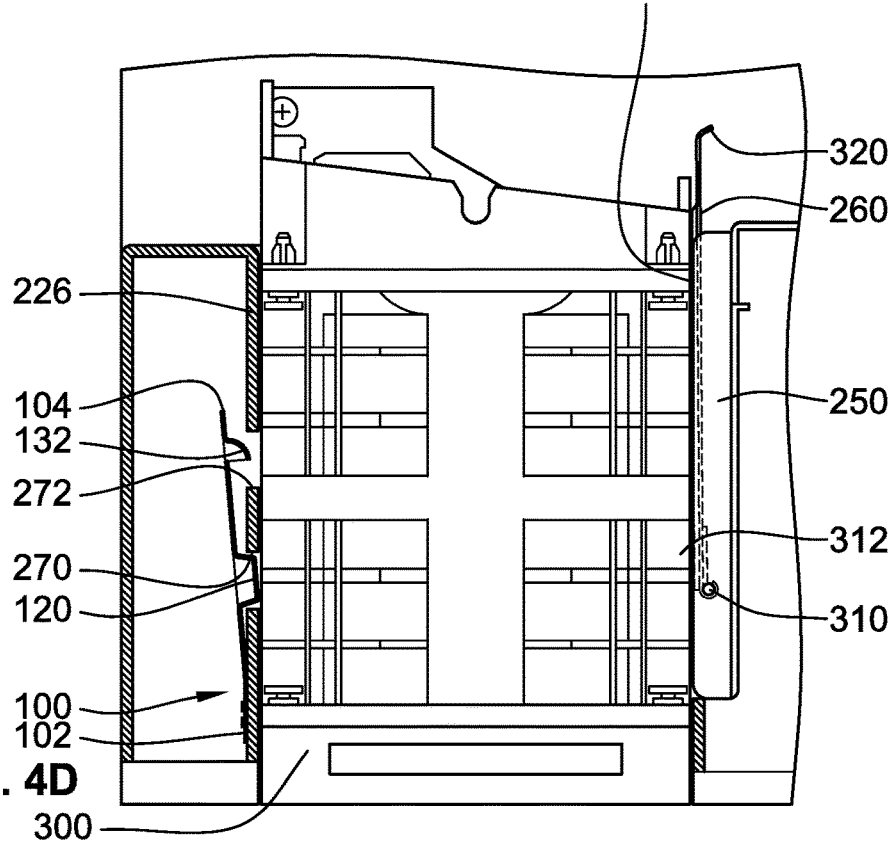
FIG. 4D is a top view of the fan module fully inserted into the socket.

FIG. 4A is a top view of a fan module 300 being initially inserted in the socket 210 in FIG. 3A with the anti-reflow device 100 in FIG. 2A installed. FIG. 4B is a top view of the fan module 300 continuing to be inserted into the socket 210 prior to the fan flap 260 swinging past the stopping feature 132 of the anti-reflow device 100. FIG. 4B thus shows the anti-reflow device 100 being forced away from the interior surface 238 of the side panel 226 towards the side panel 224 by the fan module 300. FIG. 4C is a top view of the fan module 300 being still continuing to be inserted into the socket 210 after the fan flap 260 swings past the stopping feature 132 of the anti-reflow device 100. FIG. 4D is a top view of the fan module 300 being fully inserted into the socket 210 such that the fan flap 260 is flush against the exterior surface 258 of the side panel 250.

As shown in FIG. 4A, a back edge of the fan flap 260 is attached to an exterior surface 258 of the side panel 250 via a hinge 310. A spring 312 is attached between the fan flap 260 and the exterior surface 258 of the side panel 250. The spring 312 forces the fan flap 260 to be rotated about the hinge 310 into a position blocking the socket 210. A front edge of the fan flap 260 includes a tab 320 that is positioned distally from the stopping feature 132 of the anti-reflow device 100 when the fan flap 260 blocks the socket 210, e.g., between a front edge of the socket 210 and the stopping feature 132.

The stopping feature 132 extends outward from the exterior surface 236 of the side panel 226, through the rear aperture 272 and contacts the tab 320. The embossed feature 120 extends outward from the exterior surface 236 of the side panel 226 through the forward aperture 270. Thus, when the fan module 300 is not inserted into the socket 210, the fan flap 260 is disposed in a first position. In the first position, the front edge of the fan flap 260 including the tab 320 is disposed between a front edge of the socket 210 and the stopping feature 132.

When the fan module 300 is initially inserted, the stopping feature 132 prevents the fan flap 260 from rotating inward toward the exterior surface 258 of the side panel 250. Thus, when the fan module 300 has not yet been inserted into the socket 210, or when the fan module 300 is initially being inserted into the socket 210 (as shown in FIG. 4A), the fan flap 260 blocks any airflow through the socket 210.

The fan module 300 may be inserted into the socket 210 and onto the horizontal shelf 240 by pushing the fan module 300 into the socket 210. As the fan module 300 is inserted further in the socket 210 and onto the horizontal shelf 240 as shown in FIG. 4B, the side of the fan module 300 near the exterior surface 236 of the side panel 226 contacts the embossed feature 120 of the anti-reflow device 100, which extends out from the forward aperture 270. Since only the proximal end 102 of the anti-reflow device 100 is attached to the interior surface 238 of the side panel 226, the distal end 104 of the anti-reflow device 100 is pushed away from the interior surface 238 of the side panel 226. This causes the stopping feature 132 to retract from the rear aperture 272 of the side panel 226 such that the stopping feature 132 is no longer disposed in the curved path in which the tab 320 of the fan flap 260 travels. This curved path can be circular, or can generally have any suitable amount of curvature, e.g., can have any suitable radius of curvature. In some implementations, this path is straight, or comprises a series of straight paths. The position of the tab fan flap 260 and the tab 320 is also considered to be the first position, which is generally any position of the tab 320 and the fan flap 260 prior to swinging past the rear aperture 272.

As shown in FIG. 4C, as the fan module 300 continues to be inserted into the socket 210, the fan module 300 travels past the forward and rear apertures 270, 272 in the side panel 226 and the fan flap 260 continues to rotate towards the side panel 250. Because the stopping feature 132 has been forced away from the exterior surface 236 of the side panel 226, the stopping feature 132 no longer contacts the tab 320. This allows the fan flap 260 to be pushed past the rear aperture 272 to a second position. In this second position, the tab 320 of the fan flap 260 is positioned between (i) the stopping feature 132 and the rear aperture 272 from which the stopping feature 132 extends out of, and (ii) the exterior surface 258 of the side panel 250.

As shown in FIG. 4D, once the fan module 300 is fully inserted into the socket 210, the fan flap 260 can be rotated all the way towards the side panel 250 such that the fan flap 260 is flush against the exterior surface 258 of the side panel 250. This position as shown in FIG. 4D is also considered to be the second position, which is generally any position of the tab 320 and the fan flap 260 after the tab 320 swings past the rear aperture 272. Thus, once the fan module 300 is fully inserted in the socket 210, the fan flap 260 no longer blocks the socket 210, allowing the fan module 300 to circulate air.

Figure 5A:
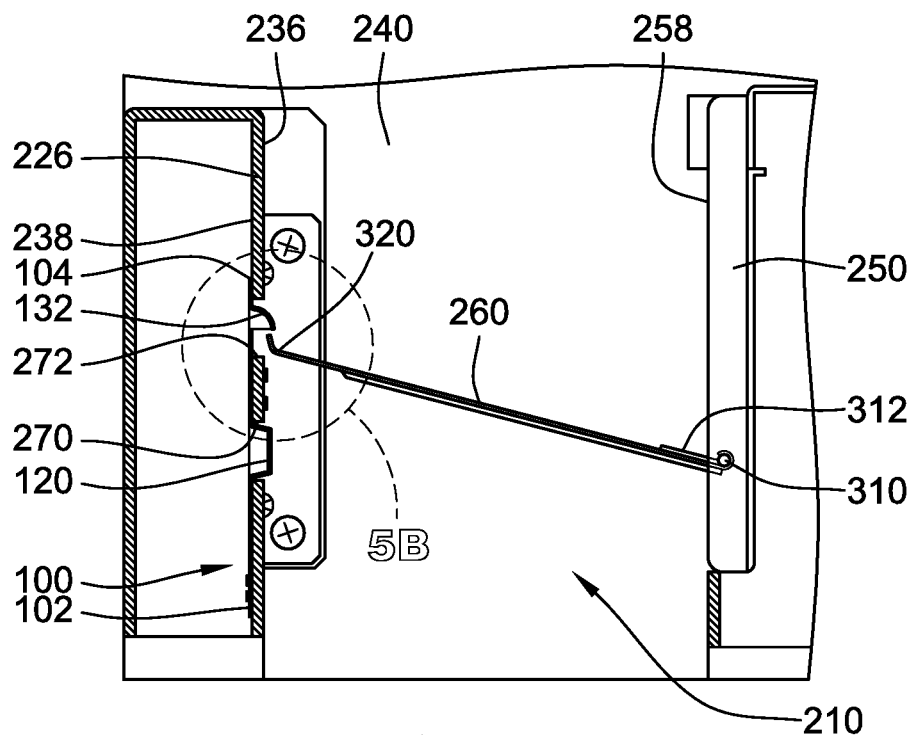
FIG. 5A is top view of the socket, showing the anti-reflow device blocking the fan flap thereby preventing failure.
Figure 5B:
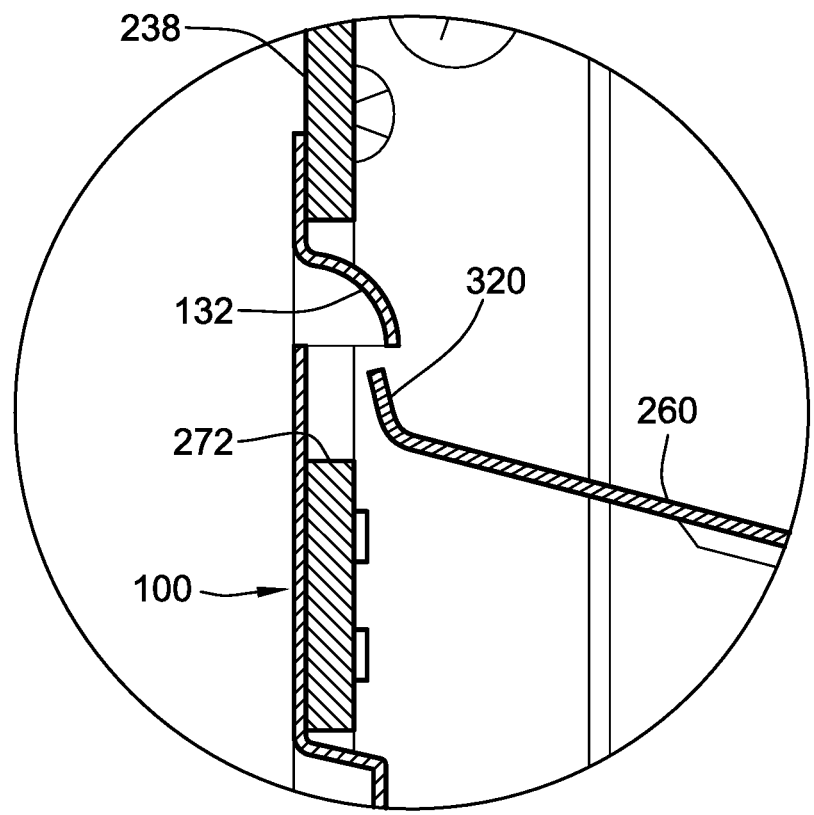
FIG. 5B is a close-up top view of the anti-reflow device preventing the fan flap from moving inward in FIG. 5A.

FIG. 5A shows the socket 210 once the fan module has been completely removed from the socket 210. FIG. 5B shows a zoomed-in view of the circular dashed area of FIG. 5A, showing the stopping feature 132 and the tab 320 of the fan flap 260 when the fan module has been completely removed from the socket. As the fan module 300 is removed from the socket 210, the spring 312 forces the fan flap 260 to be rotated away from the exterior surface 258 of the side panel 250 via the hinge 310. As the fan module 300 is being removed from the socket 210, the fan module 300 remains in contact with the embossed feature 120 of the anti-reflow device 100. Thus, the distal end 104 of the anti-reflow device 100 is still forced away from the interior surface 238 of the side panel 226, and the stopping feature 132 is still retracted from the rear aperture 272. The front edge of the fan flap 260, including the tab 320, passes from the distal side of the rear aperture 272 (e.g., between the stopping feature 132 and the exterior surface 258 of the side panel 250) to the proximal side of the rear aperture 272 (e.g., between the stopping feature 132 and the front edge of the socket 210).

Once the front edge of the fan flap 260, including the tab 320, has passed the proximal side of the rear aperture 272, the fan module 300 can be completely removed from the socket 210. Due to the force of the spring 312, the fan flap 260 will have swung to the first position between the stopping feature 132 and the front edge of the socket 210, thus covering the socket 210. However, because the fan module 300 no longer contacts the embossed feature 120 of the anti-reflow device, the distal end 104 of the anti-reflow device 100 is not forced away from the interior surface 238 of the side panel 226. The stopping feature 132 of the anti-reflow device 100 will thus again extend through the rear aperture 272 of the side panel 226.

If any air flows back through the socket 210, the tab 320 of the fan flap 260 will contact the stopping feature 132, which prevents the fan flap 260 from swinging back to the second position between the stopping feature 132 and the exterior surface 258 of the side panel 250. This in turn prevents air from reflowing back the socket 210. The stopping feature 132 thus retains the tab 320 of the fan flap 260 on the distal side of the rear aperture 272, which prevents any air from flowing back through the socket 210.

Figure 6:
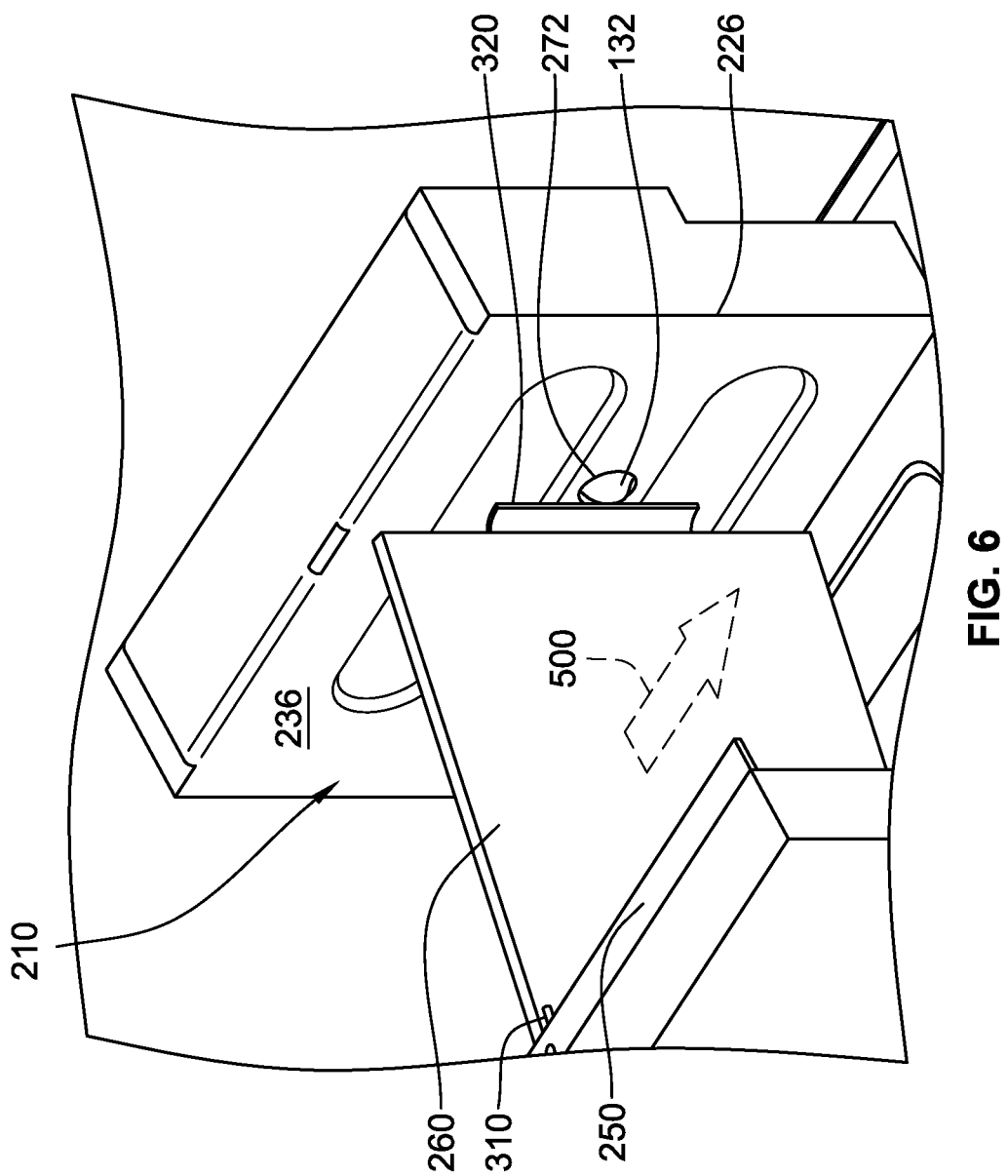
FIG. 6 is a back perspective view of the fan flap being prevented from failure by the anti-reflow device.

FIG. 6 is a back perspective view of the fan flap 260 being prevented from failure by the anti-reflow device 100 shown in the figures above. The fan flap 260 is supported by the hinge 310 that is attached to the side panel 250. The fan flap 260 swings to a position between the exterior surface of the side panel 250 and the exterior surface 236 of the side panel 226 to block the socket 210. The stopping feature 132 extends out of the rear aperture 272 from the exterior surface 236 of the side panel 226. The stopping feature 132 then contacts the tab 320 and prevents the fan flap 260 from rotating inwardly by air pressure (shown by arrow 500). Thus, the fan flap 260 prevents air flow through the vacant socket 210.

Figure 7:
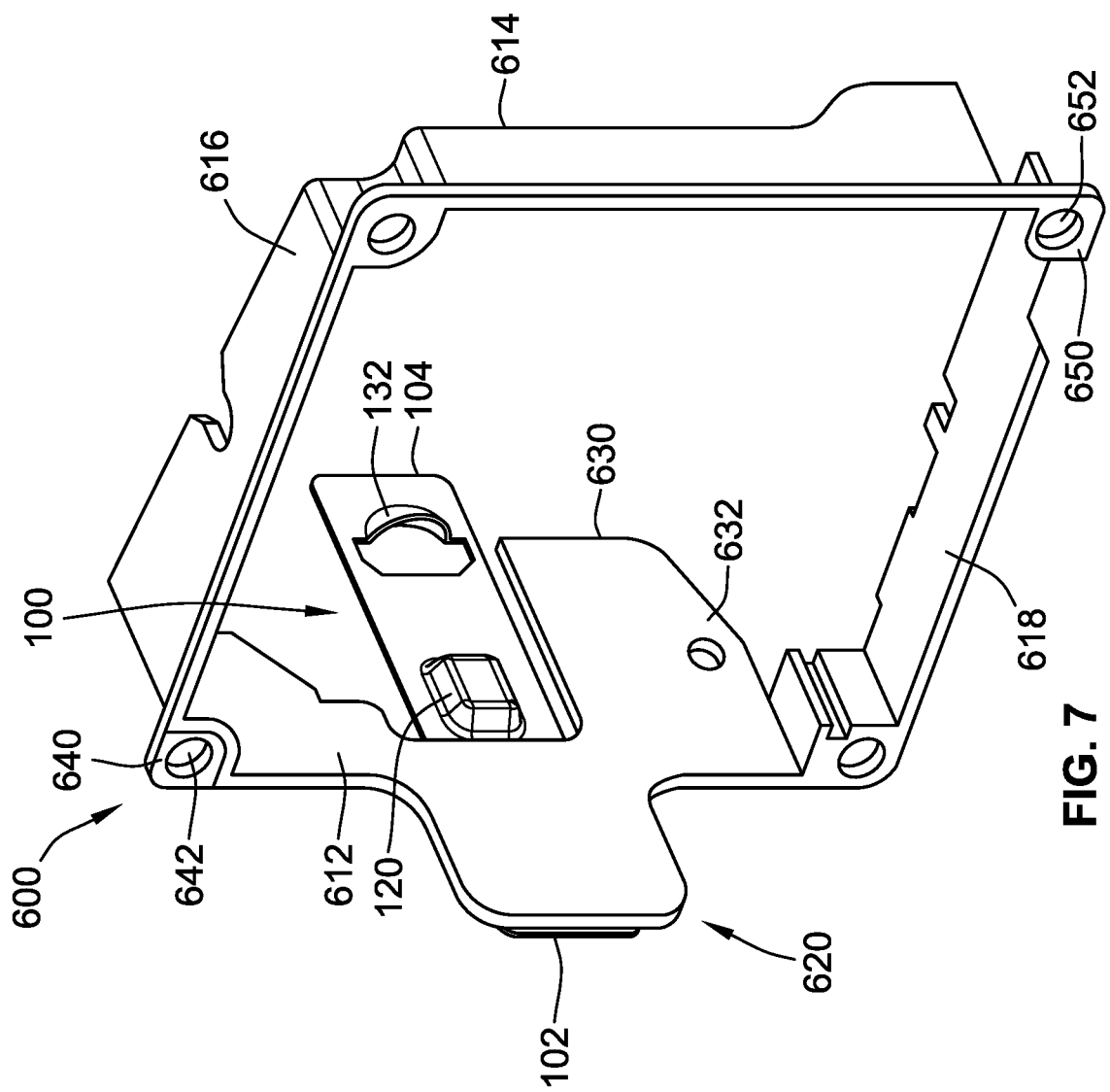
FIG. 7 is a perspective view of a support frame that may be used to install the anti-reflow device in FIG. 2A into a socket.

Another example of the disclosed features is a specialized support frame that may be used in existing sockets in a fan wall to hold the anti-reflow device 100 to prevent failure of a fan flap. FIG. 7 is a perspective view of an example support frame 600 that may be used to install the anti-reflow device in FIG. 2A into a socket, when the anti-reflow device 100 cannot be directly installed on one of the side panels of the socket. The support frame 600 includes a pair of side supports 612 and 614. The top ends of the side support 612 and the side support 614 are joined by a top support 616. A bottom support 618 is joined to the bottom end of the side support 612. The side support 612 has a relatively wider top edge that is attached to a wider end of the top support 616. The top support 616 tapers to a narrower edge that is attached to the other side support 614. In some implementations, the support frame 600 is made of a polymer, such as plastic, acrylonitrile butadiene styrene (ABS), high-density polyethylene (HDPE), low-density polyethylene (LDPE), or any other suitable polymer. The support frame 600 can also be made of any suitable type of metal, rubber, silicon-like materials, or any other material that is flexible and can deform.

The side support 612 includes a proximal mounting tab 620. The proximal end 102 of the anti-reflow device 100 can be attached to the proximal mounting tab 620. In some implementations, the proximal mounting tab 620 includes holes that align with the holes 110 and 112 of the anti-reflow device 100 (in FIGS. 2A and 2B). Fasteners such as rivets or other mechanisms may be inserted through the holes 110 and 112 of the anti-reflow device 100 and the proximal mounting tab 620 to attach the anti-reflow device 100 to the proximal mounting tab 620. The anti-reflow device 100 extends from the proximal mounting tab 620 to allow the distal end 104 to be flexed away from the side support 612. Thus, the embossed feature 120 and the stopping feature 132 may be moved between a position that extends from the plane of the side support 612 to a position behind the plane of the side support 612.

A distally extending tab 630 allows additional stability against the walls of a socket. The distally extending tab 630 includes a mounting hole 632. The top end of the side support 612 includes a mounting tab 640 with a mounting hole 642. The end of the bottom support 618 opposite from the end attached to the side support 612 includes a mounting tab 650 that can have a mounting hole 652.

Figure 8:
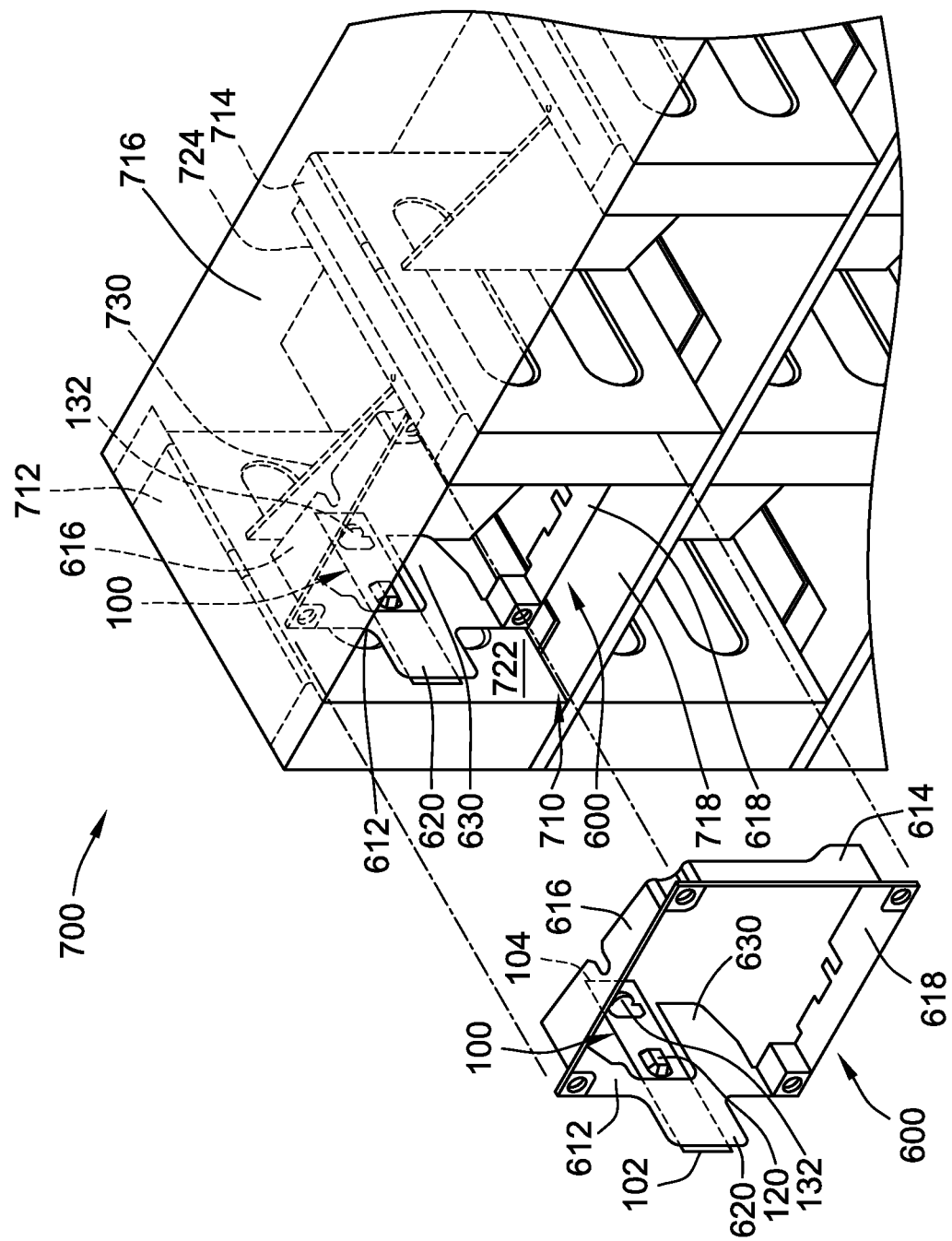
FIG. 8 is a perspective view of a socket with the support frame in FIG. 7.

FIG. 8 is a perspective view of fan wall 700 that includes a socket 710 with the support frame 600 in FIG. 7 to allow the anti-reflow device 100 in FIG. 2A to be installed. The socket 710 is defined by two side walls 712 and 714, a top shelf 716, and a bottom shelf 718. The side walls 712 and 714 are mounted on the bottom shelf 718. The side walls 712 and 714 include corresponding exterior surfaces 722 and 724. A fan flap 730 is attached via a hinge to the exterior surface 724. The fan flap 730 swings between a position flush against the exterior surface 724 and a position between the exterior surfaces 722 and 724 to block the socket 710.

As may be seen in FIG. 8, the anti-reflow device 100 is attached to the support frame 600. The support frame 600 with the attached anti-reflow device 100 is then inserted in the socket 710. The side supports 612 and 614 are in contact with the side walls 712 and 714, respectively, while the top support 616 and the bottom support 618 are in contact with the shelves 716 and 718, respectively, to provide support for an inserted fan module. Generally, the support frame 600 deforms slightly when being inserted into the socket, and thus can snap into the socket 710 and be maintained in the socket 710 via a friction fit. In other implementations, clips, latches, rods, pins, barbed features, or other fasteners may be used to secure the support frame 600 in the socket 710. When the support frame 600 is inserted in the socket 710, the anti-reflow device 100 is held between the exterior surface 722 of the side wall 712 and the proximal mounting tab 620 of the support frame 600. The distally extending tab 630 provides additional stability for the support of the anti-reflow device 100 when the support frame 600 is installed in the socket. The distal end 104 of the anti-reflow device 100 extends into the socket 710 and may be pushed back by the insertion of the fan module.

Similar to the operation explained in FIGS. 4A-4D, 5A, and 5B above, when the fan module is removed from the socket 710, the fan flap 730 rotates to block the socket 710. The stopping feature 132 of the anti-reflow device 100 prevents the fan flap 730 from failing by stopping any inward rotation of the fan flap 730. The fan flap 730 thus continues to block air flow through the socket 710 when the fan module is removed.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An anti-reflow device to prevent failure of a swinging fan flap in a socket, comprising:
   a plate having a proximal end and a distal end;
   an attachment feature disposed at the proximal end of the plate, the attachment feature attaches the proximal end of the plate to a wall of the socket to allow the distal end of the plate to move relative to the wall;
   an embossed feature extending from the plate between the proximal end and the distal end, the embossed feature contacting a fan module in response to the fan module being inserted into the socket; and
   a stopping feature extending from the distal end of the plate, the stopping feature contacting the swinging fan flap in response to the swinging fan flap moving toward the stopping feature.

2. The device of claim 1, wherein the plate has a rectangular shape.

3. The device of claim 1, wherein the attachment feature includes one or more holes, each of the one or more holes receives at least one fastener.

4. The device of claim 1, wherein the plate is fabricated from metal or plastic.

5. The device of claim 1, wherein the stopping feature has a half-dome shape.

6. The device of claim 1, wherein the embossed feature has a rectangular shape.

7. The device of claim 1, further comprising a relief cutout defined in the plate between the embossed feature and the stopping feature.

8. A fan module frame for insertion in the socket to hold the anti-reflow device of claim 1, comprising:
 a side support having a top end and a bottom end;
 a top support having a first end and a second end, the first end of the top support being coupled to the top end of the side support;
 a bottom support having a first end and a second end, the first end of the bottom support being coupled to the bottom end of the side support; and
 a support tab extending from the side support, the support tab holds the distal end of the anti-reflow device.

9. A modular fan assembly to prevent reflow, the assembly comprising:
 a socket defined by a first side wall, a second side wall, and a horizontal shelf, the socket receives a fan module;
 a swinging fan flap rotatably coupled to the first side wall, the swinging fan flap moving in a curved path relative to the first side wall; and
 an anti-reflow device coupled to the second side wall of the socket, the anti-reflow device having a proximal end and a distal end, the anti-reflow device further including:
 an attachment feature disposed at the proximal end, the attachment feature attaching the proximal end to the second side wall of the socket;
 an embossed feature disposed between the proximal end and the distal end, the embossed feature contacting the fan module in response to the fan module being inserted into the socket; and
 a stopping feature disposed at the distal end, the stopping feature contacting the swinging fan flap in response to the swinging fan flap moving toward the stopping feature.

10. The assembly of claim 9, wherein the swinging fan flap moves in the curved path between a first position and a second position.

11. The assembly of claim 10, wherein when the swinging fan flap is in the first position, a front edge of the swinging fan flap is positioned between a front edge of the socket and the stopping feature.

12. The assembly of claim 11, wherein when the swinging fan flap is in the second position, the front edge of the swinging fan flap is positioned between the stopping feature and the first side wall.

13. The assembly of claim 12, wherein the stopping feature retains the swinging fan flap in the first position when the fan module is removed from the socket.

14. The assembly of claim 9, wherein the socket receives the fan module between the first side wall and the second side wall.

15. The assembly of claim 14, wherein the anti-reflow device is coupled to a side of the second side wall opposite the fan module such that the second side wall is positioned between the anti-reflow device and the fan module.

16. The assembly of claim 15, wherein a first aperture and a second aperture are defined in the second side wall.

17. The assembly of claim 16, wherein the embossed feature of the anti-reflow device extends through the first aperture in the second side wall, and wherein the stopping feature of the anti-reflow device extends through the second aperture in the second side wall such that the stopping feature is positioned in the curved path of the swinging fan flap.

18. The assembly of claim 17, wherein the fan module contacts the embossed feature in response to the fan module being received in the socket.

19. The assembly of claim 18, wherein the contact between the fan module and the embossed feature causes the stopping feature to retract from the second aperture such that the stopping feature is not positioned in the curved path of the swinging fan flap.

20. The assembly of claim 9, wherein the swinging fan flap rotates along the curved path to a first position such that a front edge of the swinging fan flap is disposed between the stopping feature and a front edge of the socket in response to the fan module being removed from the socket, and wherein the swinging fan flap rotates along the curved path to a second position such that the front edge of the swinging fan flap is disposed between the stopping feature and the second side wall in response to the fan module being fully inserted into the socket, the stopping feature preventing the swinging fan flap from rotating from the first position to the second position when the fan module is removed from the socket.

* * * * *